(12) United States Patent
Carpenter et al.

(10) Patent No.: US 7,118,783 B2
(45) Date of Patent: Oct. 10, 2006

(54) METHODS AND APPARATUS FOR VAPOR PROCESSING OF MICRO-DEVICE WORKPIECES

(75) Inventors: Craig M. Carpenter, Boise, ID (US); Ross S. Dando, Nampa, ID (US); Dan Gealy, Kuna, ID (US); Garo J. Derderian, Boise, ID (US); Allen P. Mardian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 752 days.

(21) Appl. No.: 10/183,250

(22) Filed: Jun. 26, 2002

(65) Prior Publication Data

US 2004/0000270 A1   Jan. 1, 2004

(51) Int. Cl.
  *C23C 16/02* (2006.01)
(52) U.S. Cl. .................. 427/255.23; 427/255.28; 427/248.1; 118/719; 118/726; 118/727; 118/730
(58) Field of Classification Search ............... 118/727, 118/719, 726, 730; 95/260; 427/248.1, 427/255.23, 255.28
See application file for complete search history.

(56) References Cited

U.S. PATENT DOCUMENTS

| | | | |
|---|---|---|---|
| 4,509,456 A * | 4/1985 | Kleinert et al. | ............. 118/715 |
| 5,090,985 A * | 2/1992 | Soubeyrand et al. | ....... 65/60.52 |
| 5,131,752 A | 7/1992 | Yu et al. | |
| 5,200,023 A | 4/1993 | Gifford et al. | |
| 5,377,429 A * | 1/1995 | Sandhu et al. | ................ 34/586 |
| 5,480,818 A | 1/1996 | Matsumoto et al. | |
| 5,589,002 A | 12/1996 | Su | |
| 5,599,513 A | 2/1997 | Masaki et al. | |
| 5,643,394 A | 7/1997 | Maydan et al. | |
| 5,788,778 A | 8/1998 | Shang et al. | |
| 5,792,269 A | 8/1998 | Deacon et al. | |
| 5,851,849 A | 12/1998 | Comizzoli et al. | |
| 5,879,459 A | 3/1999 | Gadgil et al. | |
| 5,908,947 A | 6/1999 | Vaartstra | |
| 5,932,286 A | 8/1999 | Beinglass et al. | |
| 5,968,587 A | 10/1999 | Frankel | |
| 5,972,430 A | 10/1999 | DiMeo, Jr. et al. | |

(Continued)

FOREIGN PATENT DOCUMENTS

DE       19851824 A1    5/2000

(Continued)

OTHER PUBLICATIONS

U.S. Appl. No. 09/805,620, filed on Mar. 13, 2001, Carpenter et al.

(Continued)

*Primary Examiner*—Timothy Meeks
*Assistant Examiner*—Howard Abramowitz
(74) *Attorney, Agent, or Firm*—Perkins Coie LLP

(57) ABSTRACT

CVD, ALD, and other vapor processes used in processing semiconductor workpieces often require volatilizing a liquid or solid precursor. Certain embodiments of the invention provide improved and/or more consistent volatilization rates by moving a reaction vessel. In one exemplary embodiment, a reaction vessel is rotated about a rotation axis which is disposed at an angle with respect to vertical. This deposits a quantity of the reaction precursor on an interior surface of the vessel's sidewall which is exposed to the headspace as the vessel rotates. Other embodiments employ drivers adapted to move the reaction vessel in other manners, such as a pendulum arm to oscillate the vessel along an arcuate path or a mechanical linkage which moves the vessel along an elliptical path.

21 Claims, 7 Drawing Sheets

U.S. PATENT DOCUMENTS

| | | | |
|---|---|---|---|
| 6,042,652 A | 3/2000 | Hyun et al. |
| 6,059,885 A | 5/2000 | Ohashi et al. |
| 6,079,426 A | 6/2000 | Subrahmanyam et al. |
| 6,109,206 A | 8/2000 | Maydan et al. |
| 6,139,700 A | 10/2000 | Kang et al. |
| 6,143,659 A | 11/2000 | Leem |
| 6,144,060 A | 11/2000 | Park et al. |
| 6,174,377 B1 | 1/2001 | Doering et al. |
| 6,174,809 B1 | 1/2001 | Kang et al. |
| 6,203,613 B1 | 3/2001 | Gates et al. |
| 6,237,529 B1 | 5/2001 | Spahn |
| 6,270,572 B1 | 8/2001 | Kim et al. |
| 6,287,965 B1 | 9/2001 | Kang et al. |
| 6,297,539 B1 | 10/2001 | Ma et al. |
| 6,305,314 B1 | 10/2001 | Sneh et al. |
| 6,329,297 B1 | 12/2001 | Balish et al. |
| 6,342,277 B1 | 1/2002 | Sherman |
| 6,346,477 B1 | 2/2002 | Kaloyeros et al. |
| 6,374,831 B1 | 4/2002 | Chandran et al. |
| 6,387,185 B1 | 5/2002 | Doering et al. |
| 6,387,207 B1 | 5/2002 | Janakiraman et al. |
| 6,428,859 B1 | 8/2002 | Chiang et al. |
| 6,450,117 B1 | 9/2002 | Murugesh et al. |
| 6,451,119 B1 | 9/2002 | Sneh et al. |
| 6,461,436 B1 | 10/2002 | Campbell et al. |
| 6,503,330 B1 | 1/2003 | Sneh et al. |
| 6,509,280 B1 | 1/2003 | Choi |
| 6,534,007 B1 | 3/2003 | Blonigan et al. |
| 6,534,395 B1 | 3/2003 | Werkhoven et al. |
| 6,540,838 B1 | 4/2003 | Sneh et al. |
| 6,551,929 B1 | 4/2003 | Kori et al. |
| 6,562,140 B1 | 5/2003 | Bondestam et al. |
| 6,573,184 B1 | 6/2003 | Park |
| 6,579,372 B1 | 6/2003 | Park |
| 6,579,374 B1 | 6/2003 | Bondestam et al. |
| 6,630,201 B1 | 10/2003 | Chiang et al. |
| 6,635,965 B1 | 10/2003 | Lee et al. |
| 6,638,879 B1 | 10/2003 | Hsieh et al. |
| 2001/0011526 A1 | 8/2001 | Doering et al. |
| 2001/0045187 A1 | 11/2001 | Uhlenbrock |
| 2002/0007790 A1 | 1/2002 | Park |
| 2002/0043216 A1 | 4/2002 | Hwang et al. |
| 2002/0052097 A1 | 5/2002 | Park |
| 2002/0073924 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0094689 A1 | 7/2002 | Park |
| 2002/0100418 A1 | 8/2002 | Sandhu et al. |
| 2002/0104481 A1 | 8/2002 | Chiang et al. |
| 2002/0108714 A1 | 8/2002 | Doering et al. |
| 2002/0127745 A1 | 9/2002 | Lu et al. |
| 2002/0144655 A1 | 10/2002 | Chiang et al. |
| 2002/0162506 A1 | 11/2002 | Sneh et al. |
| 2002/0164420 A1 | 11/2002 | Derderian et al. |
| 2002/0195056 A1 | 12/2002 | Sandhu et al. |
| 2002/0197402 A1 | 12/2002 | Chiang et al. |
| 2003/0023338 A1 | 1/2003 | Chin et al. |
| 2003/0027428 A1 | 2/2003 | Ng et al. |
| 2003/0027431 A1 | 2/2003 | Sneh et al. |
| 2003/0066483 A1 | 4/2003 | Lee et al. |
| 2003/0070609 A1 | 4/2003 | Campbell et al. |
| 2003/0070617 A1 | 4/2003 | Kim et al. |
| 2003/0070618 A1 | 4/2003 | Campbell et al. |
| 2003/0075273 A1 | 4/2003 | Kilpela et al. |
| 2003/0079686 A1 | 5/2003 | Chen et al. |
| 2003/0098372 A1 | 5/2003 | Kim |
| 2003/0098419 A1 | 5/2003 | Ji et al. |
| 2003/0106490 A1 | 6/2003 | Jallepally et al. |
| 2003/0121608 A1 | 7/2003 | Chen et al. |
| 2003/0192645 A1 | 10/2003 | Liu et al. |

FOREIGN PATENT DOCUMENTS

| | | | |
|---|---|---|---|
| JP | 4-213818 A | | 8/1992 |
| JP | 06201539 A | * | 7/1994 |
| WO | WO 99/06610 A1 | | 2/1999 |
| WO | WO 00/40772 A1 | | 7/2000 |
| WO | WO 00/79019 A1 | | 12/2000 |
| WO | WO 02/45871 A1 | | 6/2002 |
| WO | WO 02/073329 A2 | | 9/2002 |
| WO | WO 03/008662 A2 | | 1/2003 |
| WO | WO 03/008662 A3 | | 1/2003 |
| WO | WO 03/016587 A1 | | 2/2003 |
| WO | WO 03/033762 A1 | | 4/2003 |
| WO | WO 03/035927 A2 | | 5/2003 |

OTHER PUBLICATIONS

U.S. Appl. No. 09/810,387, filed on Mar. 15, 2001, Carpenter et al.
UC Berkeley Extension, Engineering, "Atomic Layer Deposition," Dec. 11, 2001, 5 pages, http://www.unex.berkeley.edu/eng/br335/1-1.html.
IPS Integrated Process Systems, Dec. 11, 2001, 1 page, http://www.ips-tech.com/eng/main.htm.
IPS Integrated Process Systems, Nano-ALD, Dec. 11, 2001, 2 pages, http://www.ips-tech.com/eng/pro-p2.htm.
IPS Integrated Process Systems, Nano-ALD, Dec. 11, 2001, 2 pages, http://www.ips-tech.com/eng/pro-p2-2.htm.
Deublin Company, Precision Rotating Unions, Steam Joints and Siphon Systems "Precision Rotating Connections for Water, Steam, Air, Hydraulic, Vacuum, Coolant and Hot Oil Service," http://www.deublin.com, Feb. 4, 2002, 1 page.
Deublin Company, "Rotating Unions," http://www.deublin.com/products/rotatingunions.htm, Feb. 4, 2002, 1 page.
Deublin Company, "Sealing," http://www.deublin.com/products/sealing.htm, Feb. 4, 2002, 2 pages.
Electronics Times, "Atomic Layer Deposition Chamber Works at Low Temperatures," 2 pages, Dec. 11, 2001, 2001 CMP Europe Ltd., http://www.electronicstimes.com/story/OEG20010719S0042.
The University of Adelaide Australia, Department of Chemistry, Stage 2 Chemistry Social Relevance Projects, "Spectroscopy," 2 pages, Feb. 9, 2002, http://www.chemistry.adelaide.edu.au/external/Soc-Rel/content/Spectros.htm.

* cited by examiner

METHODS AND APPARATUS FOR VAPOR PROCESSING OF MICRO-DEVICE WORKPIECES

TECHNICAL FIELD

The present invention provides certain improvements in chemical delivery systems. The invention has particular utility in connection with supplying a precursor gas for chemical vapor deposition or atomic layer deposition in manufacturing a semiconductor device, a microelectronic device, a micromechanical device, or other type of micro-device.

BACKGROUND

In manufacturing integrated circuits, various thin films are deposited and patterned on a semiconductor substrate. One well-known deposition process is chemical vapor deposition (CVD). In general, CVD is a process in which a substrate, e.g., a semiconductor workpiece, is heated and coated with layers of volatile chemical compounds. During CVD, a precursor compound is reduced or dissociated in a chemical reaction on or adjacent to the substrate surface. The precursor compound is delivered to the reaction chamber in a vapor or gaseous state, often in a reaction gas which also includes a suitable carrier gas. In reactive CVD processes, the reaction gas may also include other compounds, e.g., other precursors, which react with one another. These CVD processes yield an adherent coating on a surface of the substrate.

CVD processes are used at a number of stages in semiconductor manufacture. For example, CVD can be used to produce epitaxially grown single crystal silicon by the reduction of a silicon precursor, such as silicon tetrachloride, by a reactant gas such as hydrogen. This process is used to make other epitaxial layers such as polysilicon, silicon nitride, silicon dioxide, and both doped polysilicon and silicon dioxide. CVD is also used in semiconductor manufacture to depositing various conductive films, such as aluminum and copper.

One advantage of CVD processes is that the deposited film is highly conformal, i.e., it yields a uniform film even on more complex surfaces with high aspect ratio features. As these features become smaller and ever more densely packed together, though, it is difficult to achieve uniform step coverage even with CVD. Atomic layer deposition (ALD, also referred to as atomic layer epitaxy) is an improvement of conventional CVD processes. Rather than continuously depositing material to build up a coating, ALD rapidly deposits a series of monatomic layers atop one another. Though ALD is materially slower than CVD, it improves conformality of the film.

One limitation on the variety of films which can be deposited via CVD and ALD is that the reaction precursor must be delivered in a gaseous state. Many potentially useful reaction precursors are solids or relatively low vapor pressure liquids. It can be difficult to volatilize such precursors at a rate fast enough for a commercially acceptable production throughput. It can also be difficult to maintain a consistent delivery rate of the precursor gas over the course of a deposition process, with the delivery rate often decreasing as the deposition process proceeds. If the precursor is a solid, it typically must be sublimated, which often makes it more difficult to produce the gaseous precursor at an acceptable, stable rate. This can sometimes be attributed to agglomeration from a particulate solid precursor, which reduces the effective surface area of the precursor over time, driving down the rate of volatilization.

SUMMARY

Embodiments of the present invention provide both methods and apparatus which permit efficient volatilization of a volatilizable reaction precursor which may be used in depositing a coating on a semiconductor workpiece. One of these embodiments provides a method of processing a micro-device in a reaction chamber. A volume of a volatilizable reaction precursor is placed in an interior of a vessel having a sidewall, defining a headspace in the vessel interior above the reaction precursor. The vessel is rotated about a rotation axis which is disposed at an angle with respect to vertical in a manner that deposits a quantity of the reaction precursor on an interior surface of the sidewall which is exposed to the headspace as the vessel rotates. A carrier gas is delivered to the headspace and a reaction gas, which comprises the carrier gas and a volatilized precursor, is delivered from the headspace to the reaction chamber. A reaction product is deposited on a surface of the micro-device workpiece. The reaction product is derived, at least in part, from the volatilized precursor.

An alternative embodiment defines a method of volatilizing in a volatilizable reaction precursor in a vessel which has an interior. A volume of the volatilizable reaction precursor is placed in the vessel interior, leaving a headspace in the vessel interior above the precursor. The vessel is moved to increase an exposed surface area of the precursor. A reaction gas comprising gas volatilized from the precursor is extracted from the headspace.

A micro-device workpiece processing apparatus in accordance with a different embodiment of the invention includes a reaction chamber within which a micro-device workpiece may be received. A reactant supply vessel has a sidewall which extends along a central line, an interior volume adapted to receive a volatilizable reaction precursor with a headspace above the precursor, and a transverse cross section perpendicular to the centerline. A gas conduit is in fluid communication with the headspace and with the reaction chamber. A driver is adapted to move the vessel to maintain an exposed surface area of the precursor greater than the area of the transverse cross section of the vessel.

Still another embodiment of the invention provides a volatilizer adapted to deliver a process gas from a volatilizable fluid. The volatilizer includes a reactant supply vessel having a sidewall having an interior surface and an interior volume adapted to receive a volatilizable fluid with a headspace above the fluid. A gas conduit is fluid communication with a headspace. A driver is adapted to move the vessel to coat a portion of the sidewall interior surface exposed to the headspace with the fluid.

An alternative semiconductor workpiece processing apparatus is provided by an another embodiment. This apparatus includes a reaction chamber within which a semiconductor workpiece may received. A reactant supply vessel has a generally cylindrical sidewall, a bottom, a top, and a rotation axis. The bottom sealingly engages the sidewall at a first location and a top sealingly engages the sidewall at a second location spaced from a first location to define an interior volume adapted to contain a volatilizable fluid and a headspace. The generally cylindrical sidewall has an interior surface which is wettable by the fluid. The rotation axis extends between the top and the bottom of the vessel and is disposed at an angle with respect to vertical. A gas conduit extends between the reaction chamber and the reactant supply vessel, with the gas conduit communicating gas received from the headspace to the reaction chamber. A driver is adapted to rotate the vessel about the rotation axis to wet a portion of the sidewall inner surface exposed to the headspace with the fluid.

DETAILED DESCRIPTION

Figure 1:
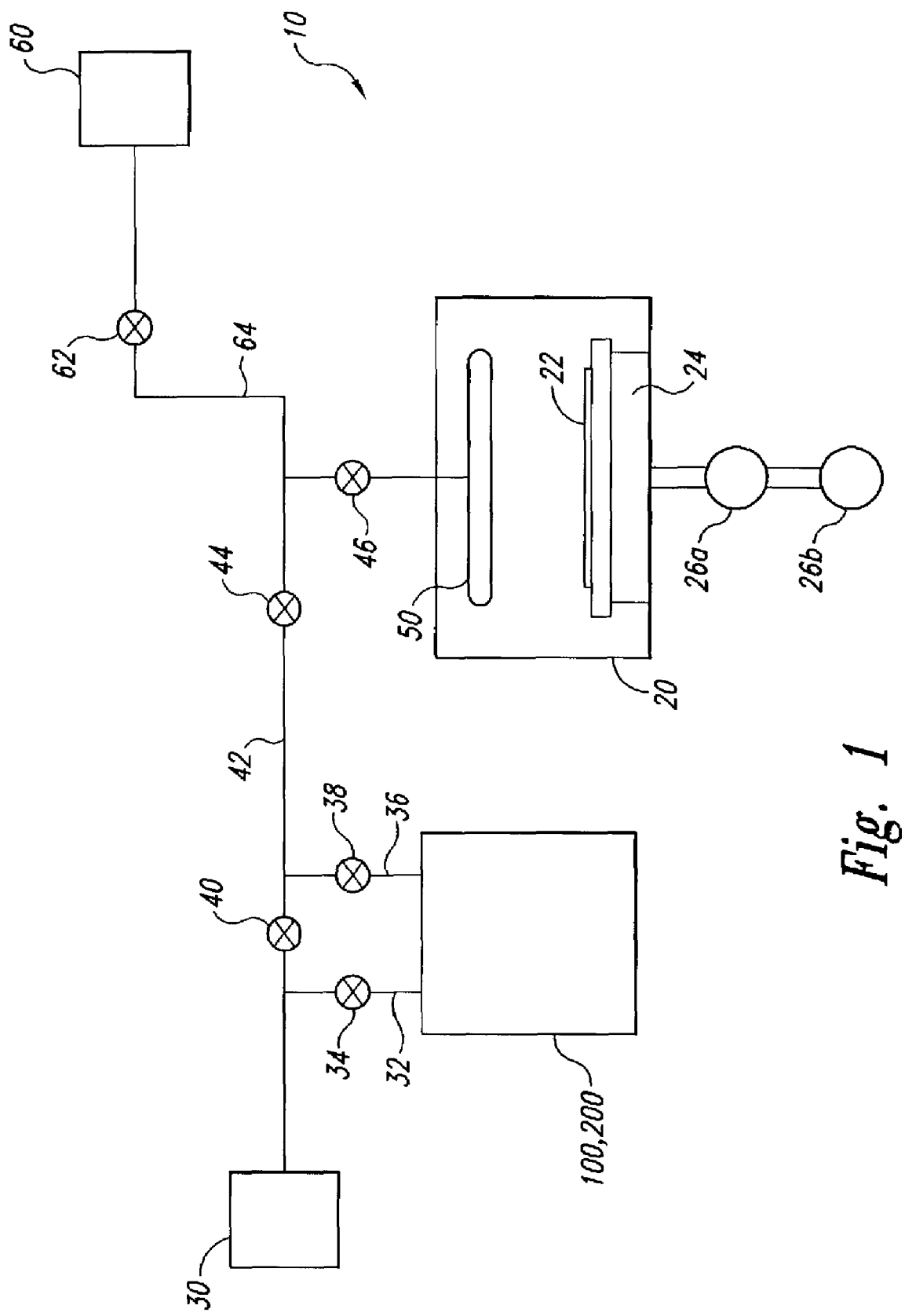
FIG. 1 is a schematic illustration of a micro-device processing apparatus in accordance with one embodiment to the invention.

Various embodiments of the present invention provide methods and apparatus for volatilizing a gas from a volatilizable reaction precursor. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

Embodiments of the invention are discussed below primarily in the context of chemical vapor deposition and/or atomic layer deposition. It should be understood, however, that aspects of the invention may be useful in any thin film deposition technique requiring a source of volatile molecules or precursors. Such techniques may include, for example, chemical vapor deposition, atomic layer deposition, metal organic chemical vapor deposition, atmospheric pressure vapor deposition, low pressure chemical vapor deposition, plasma enhanced low pressure vapor deposition, physical vapor deposition, and molecular beam epitaxy. Likewise, the following discussion focuses primarily on methods and apparatus for processing semiconductor workpieces, but in certain embodiments the substrate may comprise silicon, gallium arsenide, glass, an insulating material such as sapphire, or any other substrate material upon which thin films may be deposited.

1. Micro-Device Workpiece Processing Apparatus

FIG. 1 schematically illustrates a micro-device workpiece processing apparatus in accordance with one embodiment of the invention. The processing apparatus 10 includes a reaction chamber 20 within which a controlled atmosphere can be established. The nature of the atmosphere established within the reaction chamber 20 will vary depending on the deposition process being used. In conventional CVD processes, the reaction chamber 20 may be maintained at a reduced pressure, e.g., between about 0.1 and about 1.0 Torr. One or more vacuum pumps 26$a,b$ may be used to reduce the pressure within the reaction chamber 20.

One or more workpieces 22 may be positioned in the reaction chamber 20. The workpiece 22 is commonly maintained at a relatively constant elevated temperature during the CVD or ALD process. Temperatures on the order of about 100–500° C. are typical. In one embodiment, the workpiece 22 is heated by an electrical resistance heating plate 24 on which the workpiece 22 is supported. Other known methods of heating the workpiece 22 may also be utilized.

As explained in more detail below, a reaction gas may be generated in a volatilizer, e.g., volatilizer 100 of FIG. 2, volatilizer 200 of FIG. 3, volatilizer 300 of FIG. 4, or volatilizer 400 of FIG. 5. The reaction gas in the volatilizer can be extracted from a gas outlet line 36 and delivered to the reaction chamber 20 via a reaction gas delivery line 42. Flow of gas along this path can be regulated by one or more valves. In the illustrated embodiment, the gas flow is regulated by a gas outlet valve 38 in communication with the gas outlet line 36, a reaction gas flow valve 44 in the delivery line 42, and a chamber inlet valve 46.

In many CVD applications, a gas distributor 50 will be positioned within the reaction chamber 20 to control uniformity or flow rates of the reaction gas adjacent the surface of the semiconductor workpiece 22. Under the conditions maintained in the reaction chamber 20, the reaction gas will deposit a layer of a reaction product on the surface of the workpiece 22. The reaction product will be derived, at least in part, from a precursor which has been volatilized in the volatilizer 100 and carried to the reaction chamber 20 in the reaction gas.

In some circumstances, more than one precursor may be necessary to deposit the desired reaction product on the workpiece 22. The second precursor may be delivered from a secondary gas supply 60 via a secondary gas supply line 64. The flow rate of the secondary gas containing the second precursor may be controlled by the secondary gas supply valve 62.

In some embodiments of the invention, the reaction gas from the volatilizer 100 will consist essentially of a volatilized vapor source in the volatilizer 100. The processing apparatus 10 of FIG. 1 includes a carrier gas supply 30, though, which can be used to facilitate transport of the precursor from the volatilizer 100 to the reaction chamber 20. The carrier gas may be delivered from the carrier gas supply 30 to the volatilizer 100 via a gas inlet line 32. A gas inlet valve 34 may control the flow rate of the carrier gas into the volatilizer 100. If so desired, a volume of the carrier gas may be delivered directly to the reaction gas delivery line via bypass valve 40 to control the concentration of the volatilized precursor in the reaction gas.

2. Volatilizers

Figure 2A:
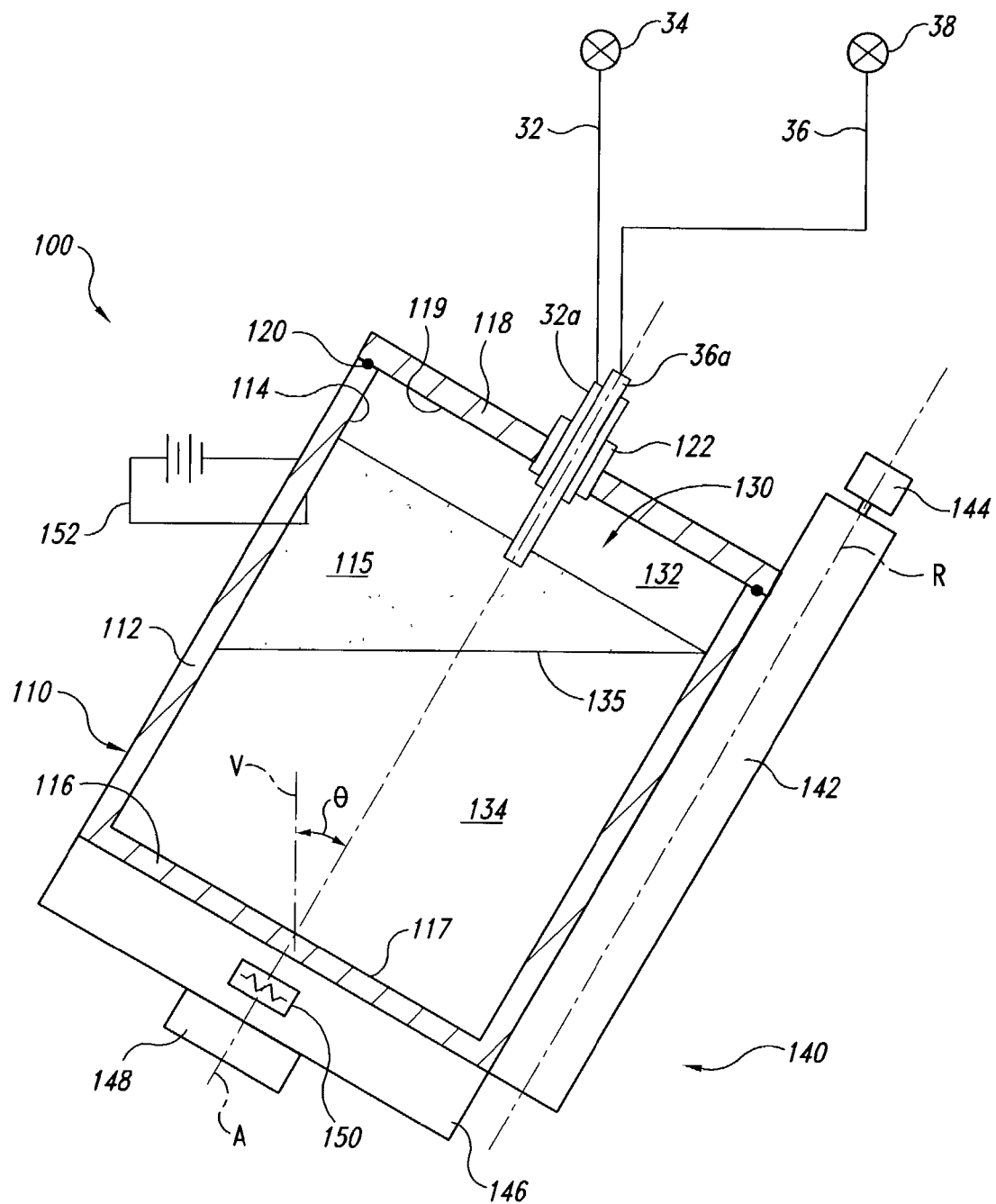
FIG. 2A is a schematic illustration of a volatilizer in accordance with an embodiment of the invention.
Figure 2B:
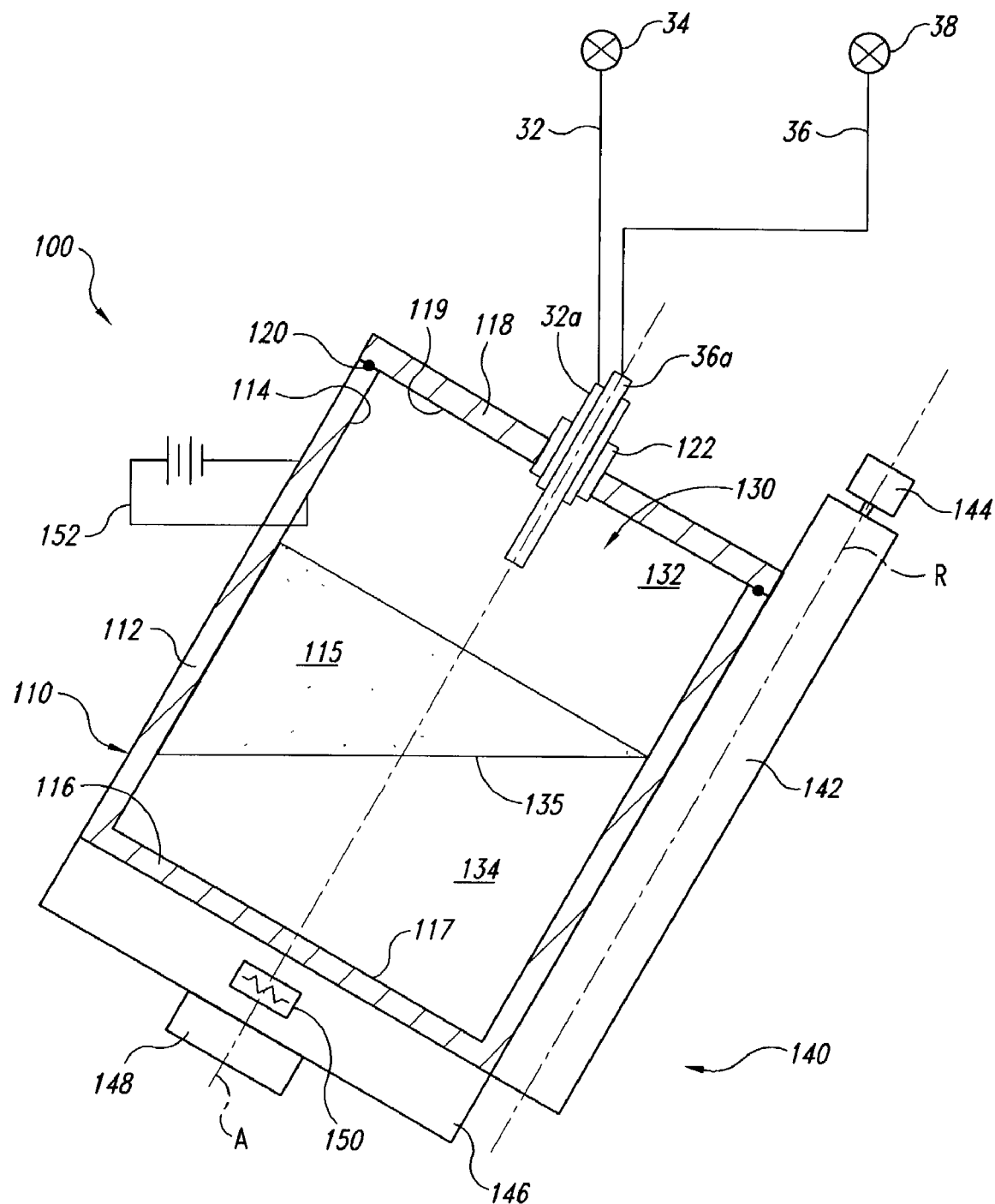
FIG. 2B is a schematic illustration of the volatilizer of FIG. 2A after some of the precursor has been volatilized.

FIGS. 2A–B illustrate a volatilizer 100 in accordance with one embodiment of the invention. FIGS. 2A and 2B show the same volatilizer 100. The only difference between the two views is that the level of the volatilizable reaction precursor 134 is lower in FIG. 2B than in FIG. 2A.

The volatilizer 100 generally includes a reactant supply vessel 110 and a drive system 140. The vessel 110 can take any desired form. The vessel 110 should define an interior volume 130 adapted to receive a volume of a volatilizable reaction precursor 134. In the illustrated embodiment, the vessel 110 includes a generally cylindrical sidewall 112 spaced radially from a central rotation axis A. A bottom 116 sealingly engages the sidewall 112 adjacent its lower edge and a top 118 is adapted to sealingly engage the sidewall 112 adjacent its upper edge. The sidewall 112, bottom 116, and top 118 together define an interior volume 130 of the reaction vessel 110. In one embodiment, the bottom 116 is formed integrally with or is otherwise permanently secured to the sidewall 112. The top 118 may be removable to facilitate placing a volume of the precursor 134 in the interior volume 130 of the vessel 110. An O-ring 120 or other sealing mechanism may be employed to improve the seal between the top 118 and the sidewall 112.

The vessel 110 shown in FIG. 2A has a straight cylindrical sidewall 112 which is perpendicular to a flat bottom 116 and a flat top 118. Any suitable shape vessel 110 could instead be employed, though. For example, the bottom 116 may be generally hemispherical in shape, and the sidewall 112 need not be cylindrical. The sidewall 112 may have a circular transverse cross section (i.e., a cross section perpendicular to the rotation axis A), though other cross-sectional shapes may also be employed. In the illustrated embodiment, the vessel 110 has a transverse cross-sectional area which remains substantially constant along a length of the rotation axis A. The reaction vessel 110 has an interior surface which comprises an interior surface 114 of the sidewall 112, an interior surface 117 of the bottom 116, and an interior surface 119 of the top 118. These interior surfaces 114, 117 and 119 should be relatively inert with respect to the precursor 134, i.e., contact between the precursor 134 and the interior surface of the vessel 110 should not unduly degrade the vessel 110 or contaminate the precursor 134 in a manner which would materially adversely affect the quality of the reaction product deposited on the semiconductor workpiece 22. The materials of the reaction vessel 110 should also be selected to withstand the rigors of use, which may include elevated processing temperatures, corrosive fluids, or friction with an abrasive particulate precursor 134. Suitable materials for forming the vessel 110 include metals, ceramics, and glass. Stainless steel may work well for most applications, provided it is not unduly reactive with the particular precursor 134 being employed.

In this embodiment, the rotation axis A of the vessel 110 is disposed at an angle θ with respect to vertical, which is indicated as line V in FIG. 2A. The angle θ may be varied as desired to optimize performance for any particular combination of vessel 110 design, volatilizable precursor 134, and gas flow rates through the gas outlet line 36. As explained below, the surface area of the precursor 134 exposed to the gas in the headspace 132 increases with increasing values of θ. Particularly for lower vapor pressure liquids and solids, the volatilization rate of the precursor 134 can be increased by increasing the angle θ to increase the exposed surface area of precursor. Care should be taken to ensure that the nonvolatilized precursor 134 (e.g., in solid or liquid form) does not get aspirated into the gas outlet tube 36a. In the embodiment of FIGS. 2A–B, an angle θ of between about 1° and about 75° is expected to suffice.

The gas outlet line 36 and the gas inlet line 32 noted above in connection with FIG. 1 may communicate with the interior volume 130 of the vessel 110 through the vessel top 118. The gas outlet line 36 includes an outlet tube 36a which extends through the top 118. The gas inlet line 32 includes an inlet tube 32a which also extends through the top 118. As explained below, the volatilizer 100 rotates the vessel 110 about the central axis A of the cylindrical sidewall 112. The inlet tube 32a and outlet tube 36a may be arranged generally concentrically to extend along the axis A. By placing a rotary coupling 122 between the top 118 and the tubes 32a and 36a, the tubes 32a and 36a can remain stationary as the vessel 110 rotates. The rotary coupling 122 should provide an effective seal between the top 118 and an exterior of the outermost tube 32a to prevent gas within the vessel 110 from escaping. Any suitable rotary coupling may be used, e.g., rotating unions such as those commercially available from Deublin Company.

As noted above, the volatilizer 100 also includes a drive system 140. The drive system 140 is adapted to move the vessel 110 to maintain an exposed surface area of the precursor 134 greater than the transverse cross-sectional area of the vessel 110. The embodiment of FIG. 2A employs a drive system 140 which is adapted to rotate the vessel 110 about the rotation axis A. This can be accomplished in any suitable fashion. In the illustrated embodiment, the drive system 140 includes a support roller 142 and a rotatable base 146. The vessel 110 may be supported by the roller 142 and base 146, with the sidewall 112 resting on the roller 142 and the bottom 116 resting on the base 146. While only a single roller 142 is shown in the schematic view of FIG. 2A, multiple rollers 142 can be used to ensure adequate support for the sidewall 112. The roller 142 may pivot about a roller axis R. This roller axis R may be substantially parallel to the rotation axis A of the vessel 110. If the vessel 110 is to be rotated by the roller 142, a roller motor 144 may be operatively connected to the roller 142 to be rotated about the roller axis R. Friction between the roller 142 and the sidewall 112 will cause the vessel 110 to rotate about its rotational axis A.

The base 146 may have a circular face which engages the bottom 116 of the vessel 110. The base 146 may rotate about the same axis A about which the vessel 110 rotates. In one embodiment, the roller 142 is driven by the roller motor 144 and the base 146 passively turns about the axis A as the vessel 110 rotates. In another embodiment, a base motor 148 rotates the base 146 which, in turn, rotates the vessel 110, and the roller 142 passively turns about its roller axis R.

The volatilizer 100 may also include other components to facilitate more efficient vaporization of the precursor 134. For example, a heater 150 may be provided to maintain the precursor 134 at a controlled elevated temperature to increase the vapor pressure of the precursor 134. Any suitable heat source can be employed. In FIG. 2A, the heater 150 is illustrated schematically as a resistance heater retained in the base 146. The heater 150 may instead comprise an RF heating coil, a heated carrier gas introduced through the gas inlet line 32, or any other heating mechanism known in the art.

If the precursor 134 in the vessel 110 is flowable, it will tend to settle to yield a generally horizontal upper surface 135. Because the vessel 110 is oriented at an angle θ with respect to vertical V, the level of the precursor 134 inside the vessel 110 is higher along the sidewall 112 on one side than it is on the other side. In the view of FIG. 2A, the precursor 134 is higher along the sidewall 112 adjacent the roller 142 than it is on the side opposite the roller 142. This creates a horizontal surface 135 of the precursor which has a surface area greater than the surface area of a transverse cross section taken perpendicular to the rotation axis A of the vessel 110, with the exposed surface area of the precursor increasing as the angle θ increases. As the vessel 110 rotates about the axis A, a different part of the sidewall will be positioned adjacent the roller and in contact with the highest level of the precursor 134. As the vessel 110 makes a full revolution about the axis A, there will be an exposed contact area 115 which was in contact with the precursor 134, but is now exposed to the headspace 132. This exposed contact area 115 will be generally crescent-shaped.

If the precursor 134 has an affinity for the interior surface 114 of the sidewall 112, a portion of the precursor 134 may be deposited on the exposed contact area 115 of the sidewall 112. If the precursor 134 is a liquid, the interior surface 114 of the sidewall 112 may be selected or treated to ensure that it is wettable by the precursor 134. By appropriately matching the rotational speed of the vessel 110 with the viscosity and other rheological properties of the liquid precursor 134, some or all of the exposed contact area 115 may be coated with a film of the precursor 134. For higher viscosity materials with low wetting contact angles, a relatively continuous film may cover a majority or all of the exposed contact area 115. For lower viscosity precursors 134 and/or precursors 134 with higher wetting contact angles, the film may be discontinuous.

If the precursor 134 is a solid instead of a liquid, the exposed contact area 115 may still carry some of the precursor 134 for exposure to the headspace 132. For example, the precursor 134 may comprise a particulate solid, e.g., a fine powder. The friction caused by rotation of the vessel 110 may generate enough static charge in the precursor 134 to cause an electrostatic attraction of the solid particles to the exposed contact area 115. This electrostatic attraction can be enhanced by providing a surface charge on the interior surface 114 of the sidewall 112, as schematically depicted by the charge generator 152 in FIG. 2A.

All other things being equal, the rate at which the precursor 134 is volatilized in the vessel 110 will be generally proportional to the exposed surface area of the precursor 134. By virtue of the inclination of the rotational axis A from vertical V, the surface area of the horizontal surface 135 of the precursor 134 is greater than the surface area which would be achieved for the same vessel if the vessel were oriented with the axis A vertically. The precursor 134 carried by the exposed contact area 115 is also exposed to the gas and the headspace 132, significantly increasing the potential surface area of the precursor 134 exposed to the headspace 132.

FIG. 2B shows the same volatilizer 100 illustrated in FIG. 2A after some of the precursor 134 has been volatilized. As noted previously, the vessel 110 has a substantially constant transverse cross section along at least a portion of the length of the rotational axis A. As a result, the combined surface area of the horizontal surface 135 of the precursor 134 and the exposed contact area 115 of the sidewall interior surface 114 remains substantially constant as the level of the precursor 134 in the vessel 110 drops. This relatively constant surface area can help stabilize the volatilization rate of the precursor 134, lending greater control to the concentration or volume of the volatilized gas from the precursor 134 in the reaction gas exiting the vessel 110 through the gas outlet line 36.

Moving the vessel 110 in accordance with embodiments of the present invention can provide benefits in addition to increasing the exposed surface area of the precursor 134. For example, as the vessel 110 rotates about the rotation axis A, friction between the sidewall 112 and the precursor 134 may cause the precursor 134 to move. If the precursor 134 is a particulate solid, this can help break up any agglomerates which may form in the bulk of the precursor. This will both increase the total surface area of the precursor and maintain a more consistent volatilization rate. Similar benefits can be achieved if the precursor 134 comprises a solid precursor carried on a media, such as ceramic beads, as is suggested in U.S. Pat. No. 5,377,429, the entire teachings of which are incorporated herein by reference.

Rotation of the vessel 110 can also promote mixing of a multi-component precursor 134. Some precursors 134 may comprise two or more components which do not form a solution or only partially form a solution. For example, the precursor 134 may comprise two immiscible liquids or a mixture of different particulate solids. Rotation of the vessel 110 about the axis A will tend to stir the multi-component precursor 134. This can improve consistency of the volume and/or composition of the reaction gas delivered from the volatilizer 100 to the reaction chamber 20.

Figure 3:
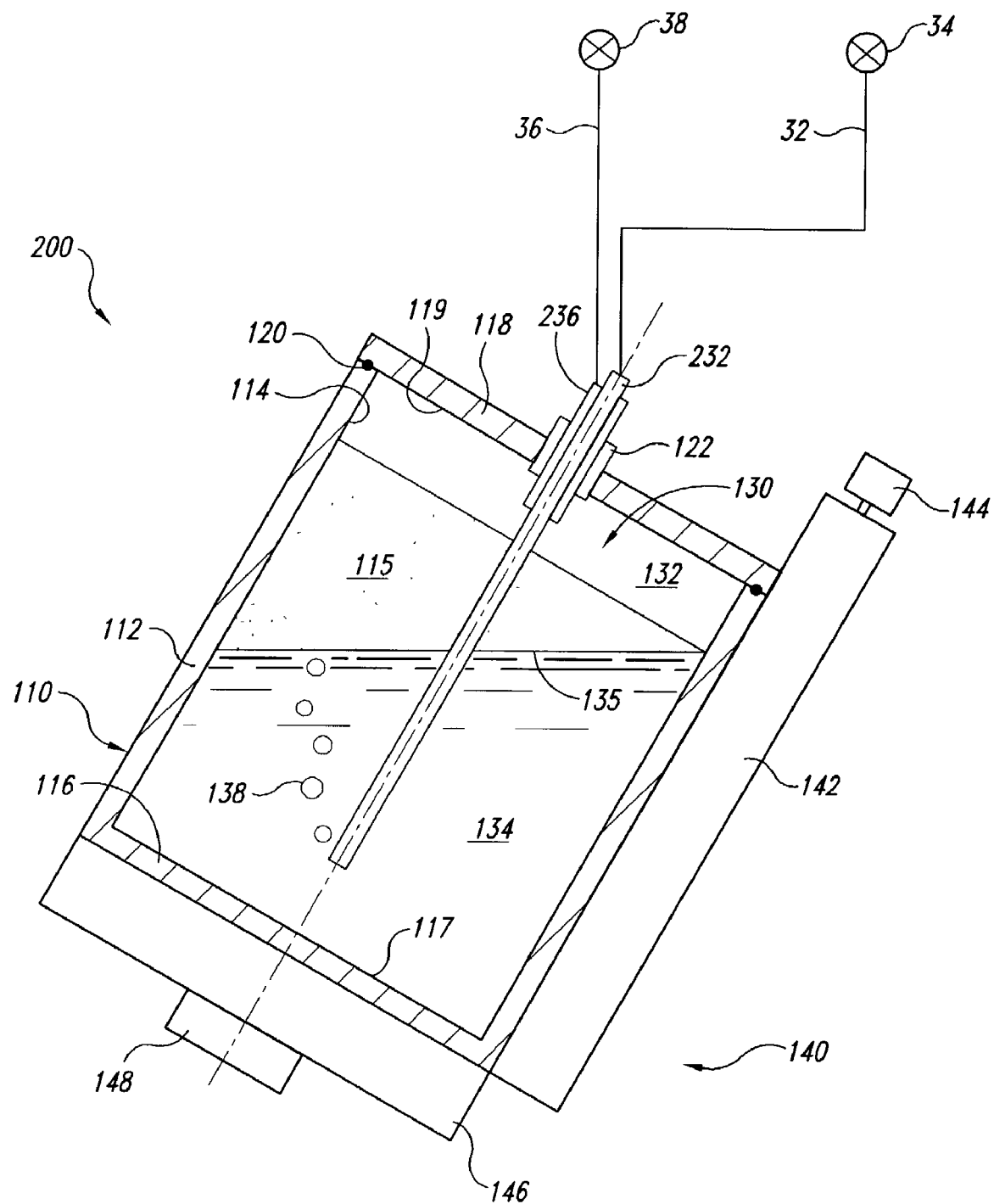
FIG. 3 is a schematic illustration, similar to FIGS. 2A–B, of a volatilizer in accordance with a different embodiment of the invention.

FIG. 3 illustrates a volatilizer 200 in accordance with an alternative embodiment of the invention. Most of the components of the vaporizer 200 may be identical to the components of the vaporizer 100 of FIGS. 2A–B. Accordingly, like reference numbers are used in both sets of drawings. The primary difference between the volatilizers 100 and 200 relates to the manner in which the carrier gas is introduced to the interior 130 of the vessel 110. In the volatilizer 100 of FIGS. 2A–B, the gas inlet tube 32a extends only a short distance into the interior 130 of the vessel 110 and terminates in the headspace 132 above the precursor 134. The gas outlet tube 36a is received within the lumen of the gas inlet tube 32a and may have an end which is spaced below the end of the gas inlet tube 32a. In the volatilizer 200 of FIG. 3, the gas inlet tube 232 extends deeper into the interior 130 of the vessel 110 to discharge the carrier gas into the precursor 134. If the precursor 134 is a liquid, as suggested in FIG. 3, bubbles 138 of the carrier gas may pass through the precursor 134 before the carrier gas enters the headspace 132. This will further increase the surface area of the carrier gas exposed to the precursor 134. In the illustrated embodiment, the gas outlet tube 236 is arranged coaxially about the gas inlet tube 232 to extract reaction gas from the headspace for delivery to the reactor 20.

As noted above, rotation of the vessel 110 can both increase the surface area of the precursor 134 exposed to the headspace 132 and promote mixture of a multi-component precursor 134. Rotation of the vessel 110 in the embodiment of FIG. 3 has yet another benefit. With a conventional "dip tube" used to discharge a carrier gas into a liquid precursor, the dip tube tends to be oriented generally vertically to extend down into the fluid. Bubbles exiting the end of the tube will often cling to the exterior surface of the dip tube and climb the tube to the surface of the precursor. A significant percentage of the surface area of the bubble is, therefore, exposed to the surface of the dip tube instead of to the precursor through which the bubble passes. By rotating the vessel 110, movement of the liquid precursor 134 will tend to dislodge the bubbles 138 from the side of the gas inlet tube 232. As a consequence, the entire surface of the bubble 138 will be exposed to the precursor 134.

Figure 4:
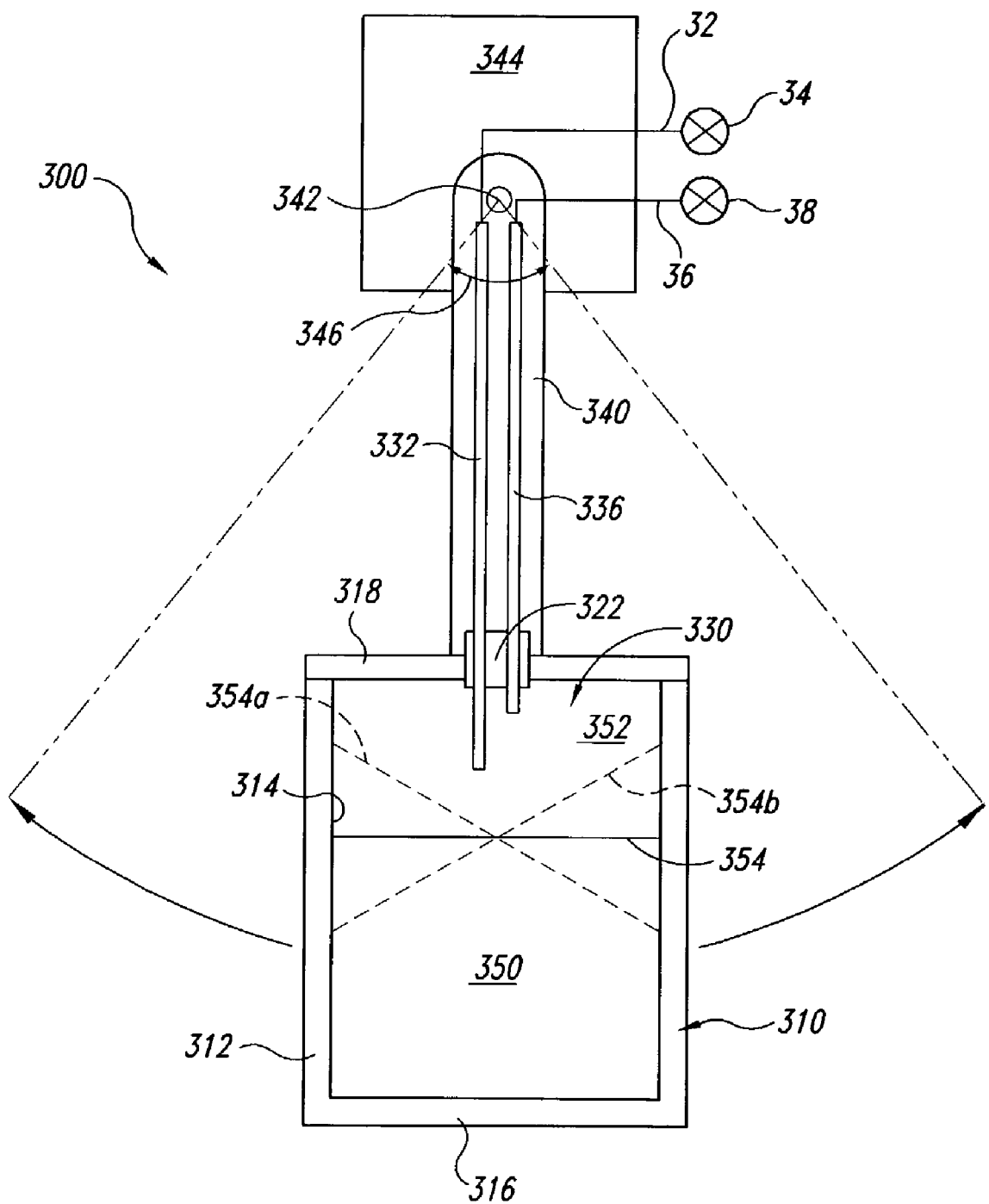
FIG. 4 is a schematic illustration of a volatilizer in accordance with yet another embodiment of the invention.

FIG. 4 schematically illustrates a different volatilizer 300 in accordance with another embodiment of the invention. The volatilizer 300 generally includes a reactant supply vessel 310 having a sidewall 312, a bottom 316, and a top 318. The sidewall 312 has an interior surface 314, which faces the interior 330 of the vessel 310. A volume of a volatilizable reaction precursor 350 may be placed in the interior 330 of the vessel 310, leaving a headspace 352 between the surface 354 of the precursor 350 and the top 318 of the vessel 310.

A carrier gas may be introduced in the headspace 352 via the gas inlet tube 332. The reaction gas may be removed from the headspace 352 via the outlet gas 336, which is in fluid communication with the gas outlet line 36. The tubes 332 and 336 can be carried by the pendulum arm 340 or travel with the pendulum arm 340. The tubes 332 and 336 may pass through a vacuum-sealed fitting 322 in the top 318 of the vessel 310.

The vessel 310 is operatively coupled to a pendulum arm 340. In the illustrated embodiment, the pendulum arm 340 is shown as an elongate rod which has an end attached to the top 318 of the vessel 310. Any suitable pendulum arm structure and coupling between the pendulum arm 340 and the vessel 310 could be used, instead. For example, the pendulum arm may form a generally V-shaped cradle which is connected to opposite sides of the sidewall 312 rather than being attached to the top 318 of the vessel 310. The pendulum arm 340 rotates about a pivot axis 342 through a pivot angle 346. The pivot axis 342 is spaced from the vessel 310, causing the vessel to follow an arcuate path. A motor 344 may drive the pendulum arm 340.

As the vessel 310 swings from one end of its arcuate path to the other, the precursor 350 will flow from side to side. FIG. 4 schematically illustrates the positions of the precursor surface 354 as the vessel 310 swings from side to side. When the vessel is stationary or along the middle of its path, the precursor surface 354 may be generally horizontal, as shown by the solid line 354. When the pendulum arm 340 swings the vessel 310 to the left end of its range of motion and begins moving the vessel 310 to the right, the inertia of the precursor 350 will cause it to flow up the left side of the sidewall, as illustrated by the dashed line 354a. Likewise, when the vessel reaches the right end of its range of motion and begins moving back to the left, the precursor will flow up the right side of the sidewall 312, as shown schematically by dashed line 354b.

As the vessel 310 moves from side to side, areas of the sidewall interior surface 314 previously covered by the precursor 350 will be exposed to the headspace 352. If the precursor 350 has an affinity for the interior surface 314 (e.g., if the precursor 350 is a liquid which can wet the interior surface 314), the volatilizable precursor 350 deposited on exposed areas of the sidewall 314 will increase the effective surface area of the precursor 350 exposed to the headspace 352. The movement of the precursor from side to side will also tend to promote mixing of a multi-component precursor 350 and help reduce agglomeration of a particulate solid precursor.

Figure 5:
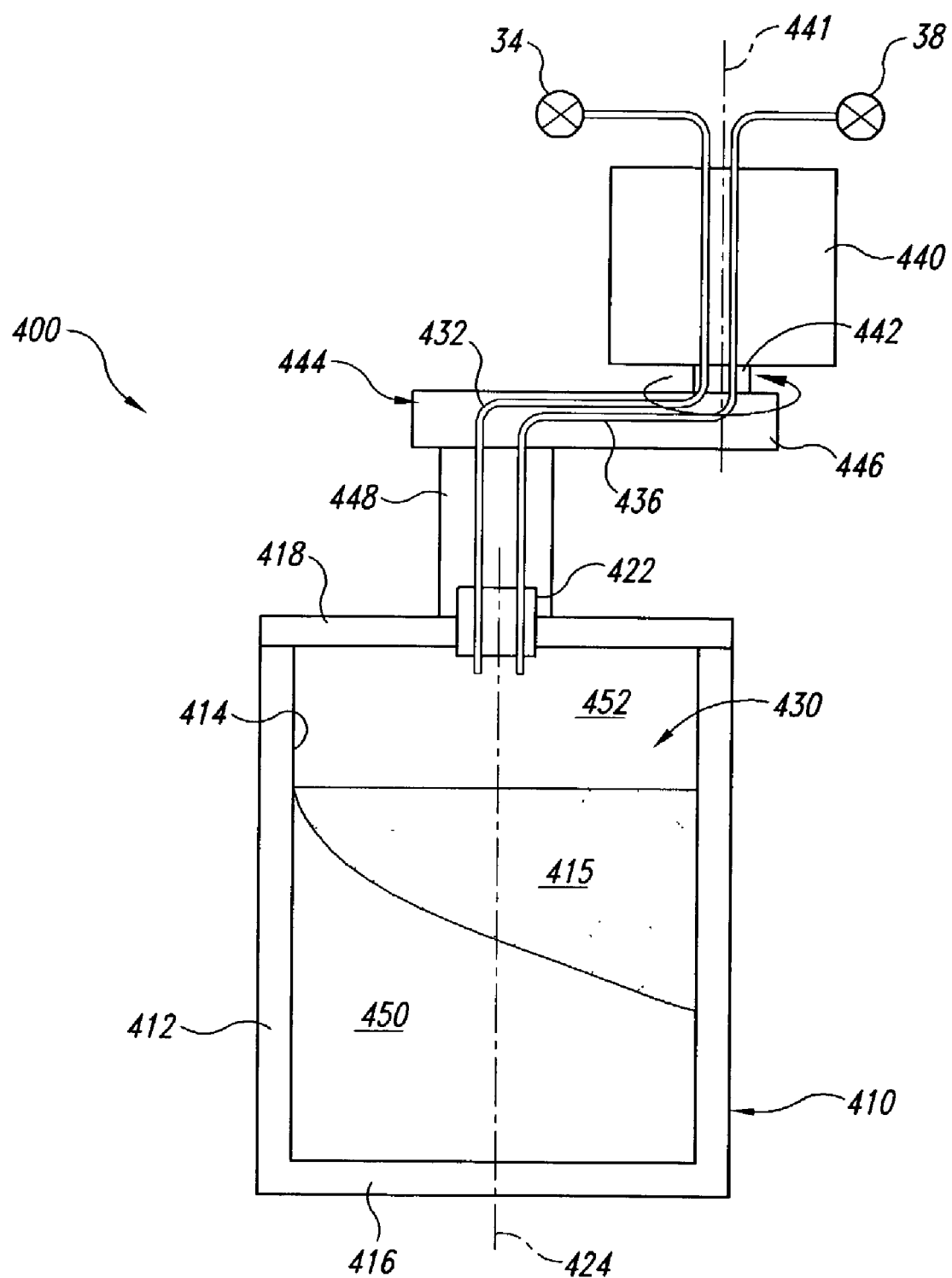
FIG. 5 is a schematic illustration of a volatilizer in accordance with still another embodiment of the invention.

FIG. 5 illustrates another alternative embodiment of the invention. The volatilizer 400 of FIG. 5 includes a reactant supply vessel 410 having a sidewall 412, a bottom 416, and a top 418. The sidewall 412 has an interior surface 414 which faces the interior 430 of the vessel 410. Carrier gas may be delivered to the headspace 452 of the vessel interior 430 via a gas delivery to 432. Reaction gas may be removed from the headspace 452 via the gas output tube 436. The gas inlet tube 432 and gas outlet tube 436 may pass through a vacuum-sealed fitting 422 in the top 418 of the vessel 410.

A motor 440 is operatively coupled to the vessel 410 by a radial link 444. The radial link 444 may include a radial arm 446 attached to an output shaft 442 of the motor 440 for rotation therewith. The reaction vessel may be attached to the radial arm 446, e.g., by a mounting shaft 448, with the centerline 424 of the vessel 410 spaced laterally from the rotational axis 441 of the motor's output shaft 442. As the radial arm 446 is rotated by the output shaft 442, the vessel 410 will travel along a path which is transverse to the centerline 424 of the vessel 410. With a simple mechanical linkage 444 as shown schematically in FIG. 5, the vessel will tend to follow a generally horizontal, circular path. Other linkages may be employed to translate to the vessel 410 along other paths, e.g., along an elongated elliptical path.

As shown schematically in FIG. 5, a flowable precursor 450 in the vessel interior 430 will tend to flow up the interior surface 414 of the sidewall 412 under the effects of centripetal force as the vessel 410 moves. As the vessel moves along its path, different areas of the sidewall interior surface 414 will be covered while previously covered areas will be exposed. This produces an exposed contact area 415 which is analogous to the exposed contact area 115 in the embodiment of FIGS. 2–3. If the precursor 450 has an affinity for the sidewall interior surface 414, precursor 450 deposited on the exposed contact area 415 will increase the effective surface area of the precursor 450. As in the previous embodiments, the motion of the vessel 410 will also promote mixing of multi-component precursors and reduce agglomeration of solid precursors.

Methods

Figure 6:
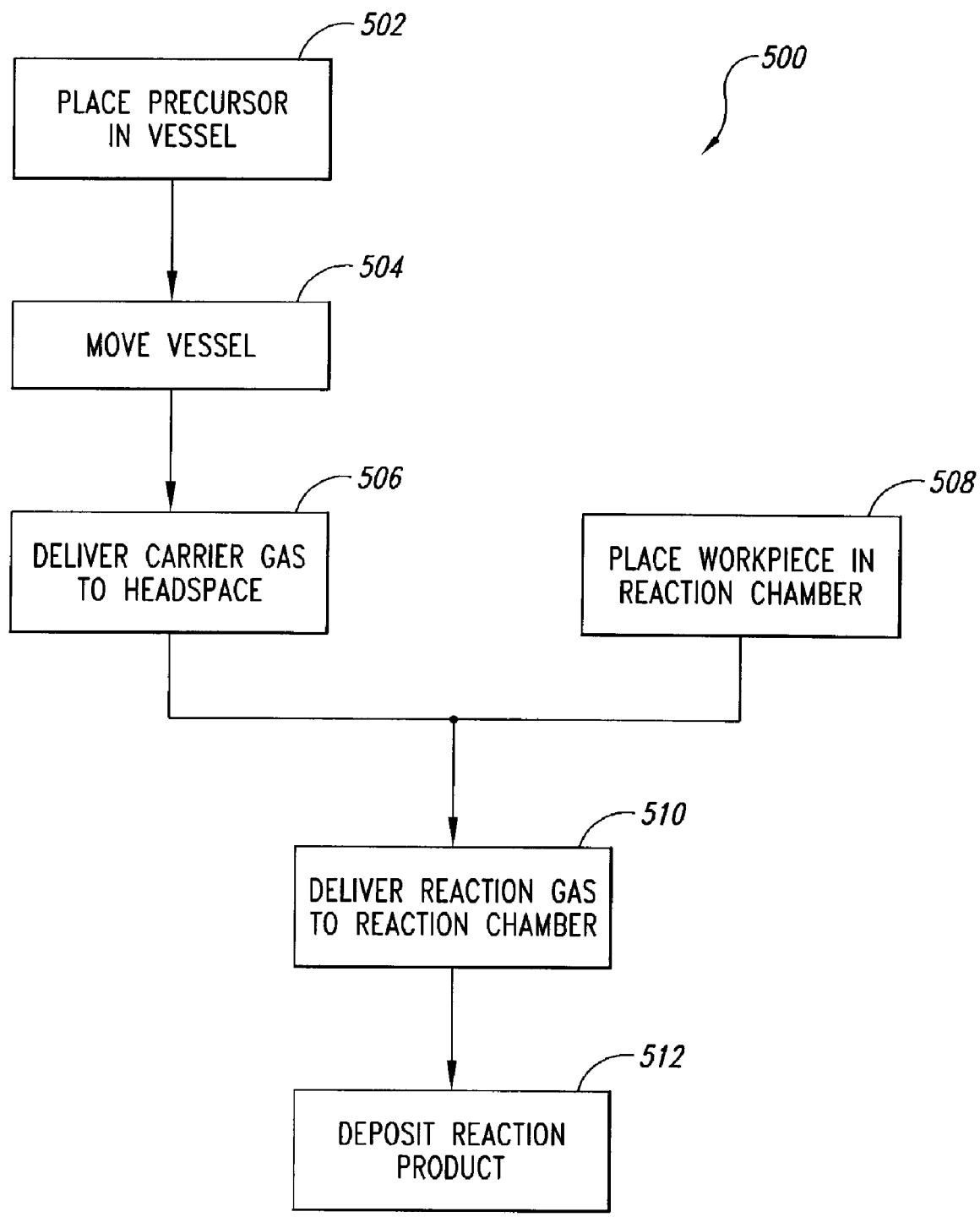
FIG. 6 is a schematic flow chart illustrating a method in accordance with an embodiment of the invention.

FIG. 6 schematically illustrates one method 500 in accordance with an embodiment of the invention. In the following discussion, reference is made to the semiconductor workpiece processing apparatus 10 of FIG. 1 and the volatilizer 100 of FIGS. 2A–B. It should be understood, though, that methods of the invention can be carried out using any suitable processing apparatus and volatilizer and need not be restricted to the specific structures shown in FIGS. 1–2. For example, one of the volatilizers 200, 300, or 400 of the FIGS. 3–5, or any other suitable volatilizer design not shown in the drawings, may be used instead of the volatilizer 100 shown in FIGS. 2A–B.

In accordance with the method 500 in FIG. 6, a volatilizable reaction precursor 134 is placed in the interior volume 130 of the reactant supply vessel 110 in step 502. If the precursor 134 is a multi-component precursor, the components can be mixed prior to being placed in the vessel or they can be added separately and movement of the vessel 110 can be used to mix the components. Once the precursor 134 is placed in the vessel 110 in step 502, the vessel 110 may be moved in step 504. In the volatilizer 100 of FIGS. 2A–B and the volatilizer 200 of FIG. 3, moving the vessel may comprise rotating the vessel 100 about an included rotation axis A. In the volatilizer 300 of FIG. 4, the vessel may be oscillated along an arcuate path. The reaction vessel 410 in the volatilizer 400 of FIG. 5 is moved along a circular or elliptical path which is transverse to the centerline 424 of the vessel 410.

In one embodiment, the vessel 110 is moved continuously at all times, even when reaction gas is not being removed from the vessel 110. In an alternative embodiment of the invention, the vessel 110 is only moved intermittently. For example, if a relatively viscous, homogenous liquid is employed as the precursor 134, it may not be necessary to continuously rotate the vessel 110 to provide a continuous coating on the exposed contact area 115; rotating the vessel 110 only intermittently may suffice to maintain a consistent surface area of the precursor 134 exposed to the headspace 132. In another embodiment of the invention, the vessel 110 is moved only when reaction gas is removed from the headspace 132 for delivery to the reaction chamber 20.

In the method 500 of FIG. 6, a carrier gas is delivered to the headspace 132 in step 506. As noted above, the use of a carrier gas may not be necessary in all circumstances. Accordingly, step 506 is optional in the method 500.

At least one semiconductor workpiece 22 is placed in the reaction chamber 20 on the heating plate 24 in step 508. The workpiece or workpieces will typically be loaded in the reaction chamber 20 with automated robotic equipment (not shown). The workpiece or workpieces 22 may be placed in the reaction chamber 20 prior to, during, or after steps 502–506.

Once the workpiece or workpieces 22 have been placed in the reaction chamber 20 in step 508 and a suitable environment is established in the reaction chamber 20, the reaction gas may be delivered to the reaction chamber 20 in step 510. If a carrier gas is employed, the reaction gas may comprise the carrier gas and vapor volatilized from the precursor 134. If no carrier gas is used, the reaction gas may consist essentially of the volatilized precursor.

In step 512 of method 500, a reaction product is deposited on a surface of the semiconductor workpiece 22 in the reaction chamber 20. This reaction product may comprise any reaction product which can be derived, at least in part, from the volatilized precursor. For example, if the volatilized precursor comprises an organometallic compound, the reaction product may comprise a metal derived from the organometallic precursor. In one embodiment of the invention, a second gas is introduced in the reaction chamber 20 from the secondary gas supply 60 while the reaction gas from the volatilizer 100 is in the reaction chamber 20. This secondary gas may be used to dilute the concentration of the reaction gas. Alternatively, the secondary gas may react with the reaction gas to deposit a reaction product derived from both gases.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of processing a micro-device workpiece in a reaction chamber, comprising:
   placing a volume of a volatilizable reaction precursor in an interior of a vessel having a sidewall and a rotation axis disposed at an angle with respect to vertical to define a headspace in the vessel interior above the volume of the reaction precursor;
   determining the angle with respect to vertical based on a volatility of the reaction precursor;
   rotating the vessel about the rotation axis in a manner that deposits a quantity of the reaction precursor on an interior surface of the sidewall exposed to the headspace and volatilizes the reaction precursor as the vessel rotates;
   delivering a carrier gas to the headspace;
   delivering a reaction gas from the headspace to the reaction chamber, the reaction gas comprising the carrier gas and the volatilized precursor; and
   depositing a reaction product on a surface of the micro-device workpiece, the reaction product being derived, at least in part, from the volatilized precursor.

2. The method of claim 1 wherein determining the angle with respect to vertical comprises increasing the angle to increase the interior surface of the sidewall exposed to the headspace.

3. The method of claim 1 wherein the angle is between about 1° and about 75° with respect to vertical.

4. The method of claim 1 wherein placing a volume of the precursor in the vessel interior comprises placing at least two components in the interior, and wherein rotating the vessel promotes mixing of the components.

5. The method of claim 1 wherein the reaction precursor comprises a liquid and depositing the reaction precursor on the exposed interior surface comprises wetting the interior surface with the liquid.

6. The method of claim 5 wherein wetting the exposed interior surface coats a portion of the exposed interior surface with a film of the liquid.

7. The method of claim 5 wherein the vessel is rotated at a rate selected such that wetting the exposed interior surface coats a portion of the exposed interior surface with a continuous film of the liquid.

8. The method of claim 1 wherein the reaction precursor comprises a particulate solid and depositing the reaction precursor on the exposed interior surface comprises electrostatically attracting solid particles to the exposed interior surface.

9. A method of volatilizing a volatilizable reaction precursor having a volatility in a vessel having an interior and a central rotation axis at an angle with respect to vertical, comprising:
   placing a volume of the volatilizable reaction precursor in the vessel interior, leaving a headspace in the vessel interior above the volume of the volatilizable reaction precursor;
   determining the angle with respect to vertical based on the volatility of the reaction precursor;
   moving the vessel about the central rotation axis to volatilize the reaction precursor; and
   extracting from the headspace a reaction gas comprising the volatilized reaction precursor.

10. The method of claim 9 wherein the angle is between about 1° and about 75° with respect to vertical.

11. The method of claim 9 wherein moving the vessel comprising translating the vessel along a path which is transverse to the central axis.

12. The method of claim 11 wherein the vessel is translated along a horizontal path.

13. The method of claim 9 wherein the vessel is moved along an arcuate path.

14. The method of claim 9 wherein the vessel is pivoted about a pivot axis displaced from the vessel to move the vessel along an arcuate path.

15. The method of claim 9 wherein the vessel is moved continuously as the reaction gas is extracted from the headspace.

16. The method of claim 9 wherein the vessel is moved intermittently.

17. The method of claim 9 wherein placing a volume of the precursor in the vessel interior comprises placing at least two components in the interior, and wherein moving the vessel promotes mixing of the components.

18. The method of claim 9 wherein the reaction precursor comprises a liquid and moving the vessel wets an interior surface of the vessel exposed to the headspace with the liquid.

19. The method of claim 18 wherein wetting the exposed interior surface coats a portion of the exposed interior surface with a film of the liquid.

20. The method of claim 18 wherein the vessel is rotated at a rate selected such that wetting the exposed interior surface coats a portion of the exposed interior surface with a continuous film of the liquid.

21. The method of claim 9 wherein the reaction precursor comprises a particulate solid and solid particles of the reaction precursor are attracted to an interior surface of the vessel as the vessel moves.

* * * * *